United States Patent [19]

Arakawa

[11] Patent Number: 5,548,142
[45] Date of Patent: Aug. 20, 1996

[54] SOLID-STATE IMAGING DEVICE CAPABLE OF REMOVING INFLUENCE BY FALSE SIGNALS

[75] Inventor: Kenichi Arakawa, Yokohama, Japan

[73] Assignee: Kabushiki Kaisha Toshiba, Kanagawa-Ken, Japan

[21] Appl. No.: 442,870

[22] Filed: May 17, 1995

Related U.S. Application Data

[63] Continuation of Ser. No. 112,139, Aug. 26, 1993, abandoned.

[30] Foreign Application Priority Data

Aug. 27, 1992 [JP] Japan .................................. 4-228676

[51] Int. Cl.$^6$ .................. H01L 27/148; H01L 29/768
[52] U.S. Cl. .................... 257/234; 257/219; 257/243; 257/221
[58] Field of Search .................................. 257/221, 223, 257/229, 230, 445, 224, 219, 243

[56] References Cited

U.S. PATENT DOCUMENTS 5,233,429  8/1993  Jung ........................................ 257/223

*Primary Examiner*—Jerome Jackson, Jr.
*Assistant Examiner*—John F. Guay
*Attorney, Agent, or Firm*—Finnegan, Henderson, Farabow, Garrett & Dunner, L.L.P.

[57] ABSTRACT

A solid-state imaging device capable of removing undesired influences, includes a semiconductor substrate having one of conductive types, a well layer arranged on the substrate and having the other conductive type opposite to the substrate, photo-sensitive pixels recessed in a matrix having a predetermined number and having the conductive type opposite to the well layer to generate signal charges corresponding to an incident light amount, a transfer channel formed along one direction of the photosensitive pixels arranged by the conductive type as the same as that of the substrate to transfer the signal charges generated by the photosensitive pixels, an electrode provided to the transfer channel on a side opposite to the substrate to supply an electric field to the transfer channel, and a barrier well formed of the impurity semiconductor material of the conductive type opposite to the conductive type of the semiconductor substrate in the manner that an impurity density of the well layer becomes longer along the transfer channel and for covering both ends in a width direction of the transfer channel at a plane opposite to the electrode, and for preventing an invasion of signal charges occurring in the well layer into the transfer channel. In such a construction, there is partially formed higher portion of the fringe electric field to the channel in a bulk along the transfer channel, and the partially higher portion of the field is kept as a path in which the signal charges are moving in a high-speed. Therefore, it is possible suppress the decrease of the transfer efficiency of the signal charges in the high-speed operation and to prevent the invasion of false signals such as smear charges by the barrier well provided around.

5 Claims, 3 Drawing Sheets

SOLID-STATE IMAGING DEVICE CAPABLE OF REMOVING INFLUENCE BY FALSE SIGNALS

This application is a continuation of application Ser. No. 08/112,139, filed Aug. 26, 1993, now abandoned.

BACKGROUND OF THE INVENTION

The present invention relates to solid-state imaging devices capable of removing undesired influences by false signals resulting in smear and blooming phenomena, and more particularly, relates to solid-state imaging device such as a charge coupled device (CCD) capable of excluding undesired influences caused by false signals even when signal charges having a low level are transferred. Here, a smear phenomenon means that white points are extended in vertical stripes in a reproduced picture plane, which are caused by light impinging onto signal lines and the CCD, or signal charges occurring inside a semiconductor substrate, which extend by diffusion and affect adjacent pixels and a transfer portion. Blooming is a phenomenon which resembles smear phenomenon and often accompanies a smear. Blooming is a phenomenon in which a white portion is extended around a light in the manner that a white flower is blooming on the picture plane, because an incident strong light makes the pixels saturated and signal charges overflow to affect the adjacent pixels, signal lines and vertical transfer CCD.

There is described an example of a conventional solid-state imaging device with reference to attached drawing. FIG. 1 is a sectional view showing a sensitive portion of an interline transfer (IT) type solid-state imaging device, in which a p-type impurity well 2 is formed on a surface of an n-type semiconductor substrate 1. The p-well 2 has a recessed photodiode 3 for generating signal charges corresponding to an incident light amount, and a vertical transfer channel 4 for transferring the signal charges in the vertical direction on the paper. A metal electrode 8 is formed on the vertical transfer channel 4 through an insulating layer such as a silicon oxide layer (not shown). The metal electrode 8 functions in part as a gate for transferring the signal charges accumulated in the photodiode 3 to the vertical transfer channel 4 by adding a high electric field, and in part for delivering the signal charges in the vertical transfer channel 4 in one direction by adding a moving electric field of a plurality of electrodes. The photodiode 3 has a construction in which a $p^+$-type impurity layer is provided on an upper surface of a semiconductor device in order to reduce a dark current occurring on the upper surface of the semiconductor device. A p-type barrier well 5 is formed around the transfer channel 4 for preventing the transfer channel 4 from an invasion of smear charges. The p-type barrier well 5 has an impurity density of one digit higher than the p-well 2 in order to suppress an extension of a depletion layer in the transfer channel 4. Furthermore, an element separation layer 6 is formed by a p-type impurity and adjacent to the transfer channel 4. A description of an insulation layer and a protective layer is omitted.

There are two types of solid-state imaging devices, namely, an IT type and a frame interline transfer (FIT) type. The IT type has a sensitive portion in which a photodiode and transfer portion are horizontally arranged to one another, while the FIT type has accumulating portion formed from the transfer portion in addition to the sensitive portion. In the IT type solid-state imaging device, the signal charges are transferred from the photodiode to the adjacent transfer portion during a vertical retrace line interval of a television signal. On the contrary, in the FIT type solid-state the signal charges are moved from the photodiode to the adjacent transfer portion, and at the same time, the signal charges are transferred to the accumulating portion. Therefore, since the moving distance of the signal charges in FIT type devices is longer than in the IT type device, it is necessary to move the charges very quickly in the transfer channel.

However, when the solid-state imaging device has the construction including the barrier well 5 effective to prevent the smear phenomenon, it is possible to prevent the extension of the depletion layer in the vertical transfer channel 4 into the semiconductor device, thereby decreasing the transfer efficiency by reducing a fringe electric field added to the transfer channel in a bulk. In the FIT type device for moving the signal charges quickly, when the barrier well is provided, there occur problems that the vertical resolution is reduced at transferring low level signal charges. Accordingly, the barrier well is not provided for the FIT type device to keep the high-speed operation of the vertical transfer of the signal charges to increase the fringe electric field in the bulk. Alternatively, the FIT type device is used in a range for obtaining the necessary transfer efficiency by decreasing the transfer frequency at the sacrifice of the high-speed operation.

SUMMARY OF THE INVENTION

Accordingly, an object of the present invention is to provide a solid-state imaging device capable of reducing undesired influences such as smear and blooming phenomena caused by false signals without decreasing the vertical resolution even when the low level signal charges are transferred.

In order to achieve the above object, a solid-state imaging device according to the present invention comprises a semiconductor substrate formed on the semiconductor substrate in the manner of having one of conductive types, a sensitive pixel having another conductive type opposite to one conductive type of the substrate for generating signal charges corresponding to an incident light amount, a transfer channel having another conductive type opposite to the substrate for transferring the signal charges, an electrode for adding to the transfer channel with an electric field, and a barrier well formed in the manner of covering the transfer channel and having another conductive type opposite to the substrate for preventing the transfer channel from an invasion of the charges occurring in the semiconductor substrate, wherein the barrier well has a gap region or a low impurity density region which is formed along and under the transfer channel.

The present invention has the construction of providing the low impurity density region or the gap region in the barrier well under the transfer channel which causes the signal charges of the solid-state imaging device to be moved. Therefore, it is possible to partially increasing the fringe electric field of the channel in the bulk. The partially high fringe portion is formed along the transfer channel to keep the high moving path of the signal charges in the channel by the high fringe electric field, thereby it is possible to suppress the reduction of the transfer efficiency of the signal charges in high-speed operation, and to prevent the invasion of the smear charges by means of the barrier well provided around the transfer channel.

As described above, the present invention can partially form the high fringe electric field region in the bulk even though the barrier well is provided under the vertical transfer channel. Accordingly, even in the FIT type solid-state imaging device, it is possible to provide the barrier well layer around the vertical transfer channel, thereby extremely reducing undesired influences such as a smear and blooming caused by false signals.

DETAILED DESCRIPTION OF THE PREFERRED EMBODIMENT

There will now be described preferred embodiments of a solid-state imaging device according to the present invention with reference to the attached drawings.

Figure 1:
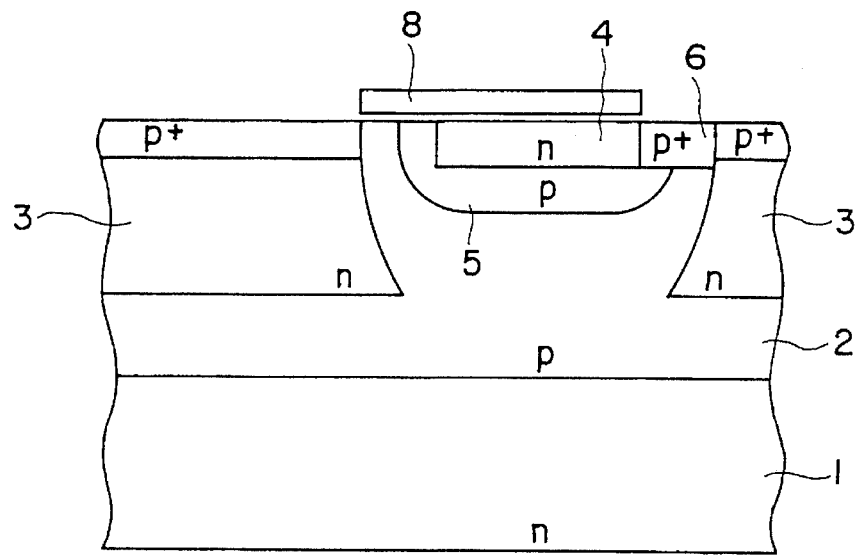
FIG. 1 is a sectional view showing a schematic configuration near a transfer channel of the conventional solid-state imaging device.
Figure 2:
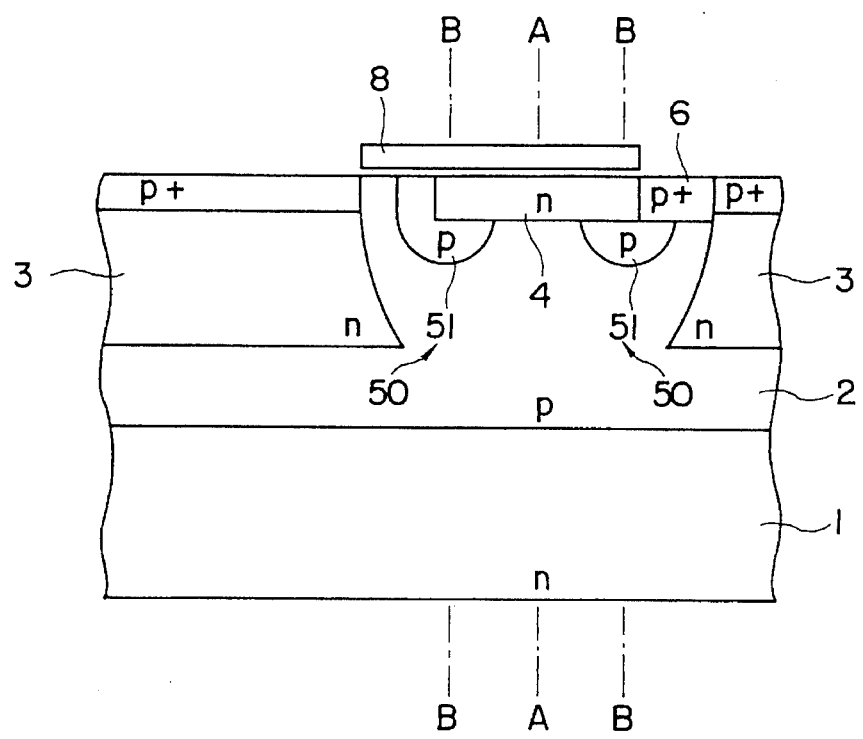
FIG. 2 is a sectional view showing a schematic configuration near a transfer channel of a solid-state imaging device according to a first embodiment of the present invention.

FIG. 2 is a sectional view showing a sensitive portion of the solid-state imaging device according to a first embodiment. In the figure, the same or corresponding portions as or to those shown in FIG. 1 are labeled by the same numerals in FIG. 1 and the description thereof is omitted.

In FIG. 2, a p-type impurity well 2 is formed in an n-type semiconductor substrate 1. The p-well 2 comprises a recessed photodiode 3, and a vertical transfer channel 4 for transferring signal charges in a vertical direction on the paper. The vertical transfer channel 4 has an impurity density such as "$1 \times 10^{17}$" $cm^{-3}$, and an electrode 8 is provided through an insulating layer on the vertical transfer channel 4. The photodiode 3 has the construction having $p^+$-type impurity layer on the upper surface of the semiconductor substrate in order to reduce a dark current occurring on the upper surface of the semiconductor substrate.

Furthermore, an element separation layer 6 is formed by a p-type impurity adjacent to the transfer channel 4. There is provided a p-type barrier well layer 51 as a barrier well having a conductive type opposite to that of the semiconductor substrate around the transfer channel 4 in order to prevent the invasion of the smear charges. The p-type barrier well 51 has an impurity density such as "$1 \times 10^{16}$" $cm^{-3}$ which is one digit higher than that of the p-well 2 for suppressing the extension of the depletion layer of the transfer channel 4. The barrier well layer 51 has a construction of including a gap provided under the vertical transfer channel, and the gap thereof is provided in parallel with the transfer direction of the signal charges by the transfer channel 4 (namely, in the vertical direction against the paper surface). The gap may provided anywhere under the transfer channel.

Such a construction can be obtained through the steps of forming the barrier well 50 by ion injection near both ends of the vertical transfer channel 4 by a high-acceleration ion injection apparatus, and connecting the barrier well to the element separation layer 6, is provided at the side wall of the vertical transfer channel 4. In this case, since the thermal diffusion of the barrier well can be suppressed, it is advantageous that the n-type impurity profile does not substantially change in the vertical transfer channel 4. Furthermore, the barrier well layer 51 may be formed by thermal diffusion at both ends of the vertical transfer channel 4. In this case, since the n-type impurity of the vertical transfer channel 4 is cancelled by the p-type impurity layer of the barrier well 51, it is necessary to compensate a density of the transfer channel.

Figure 3:
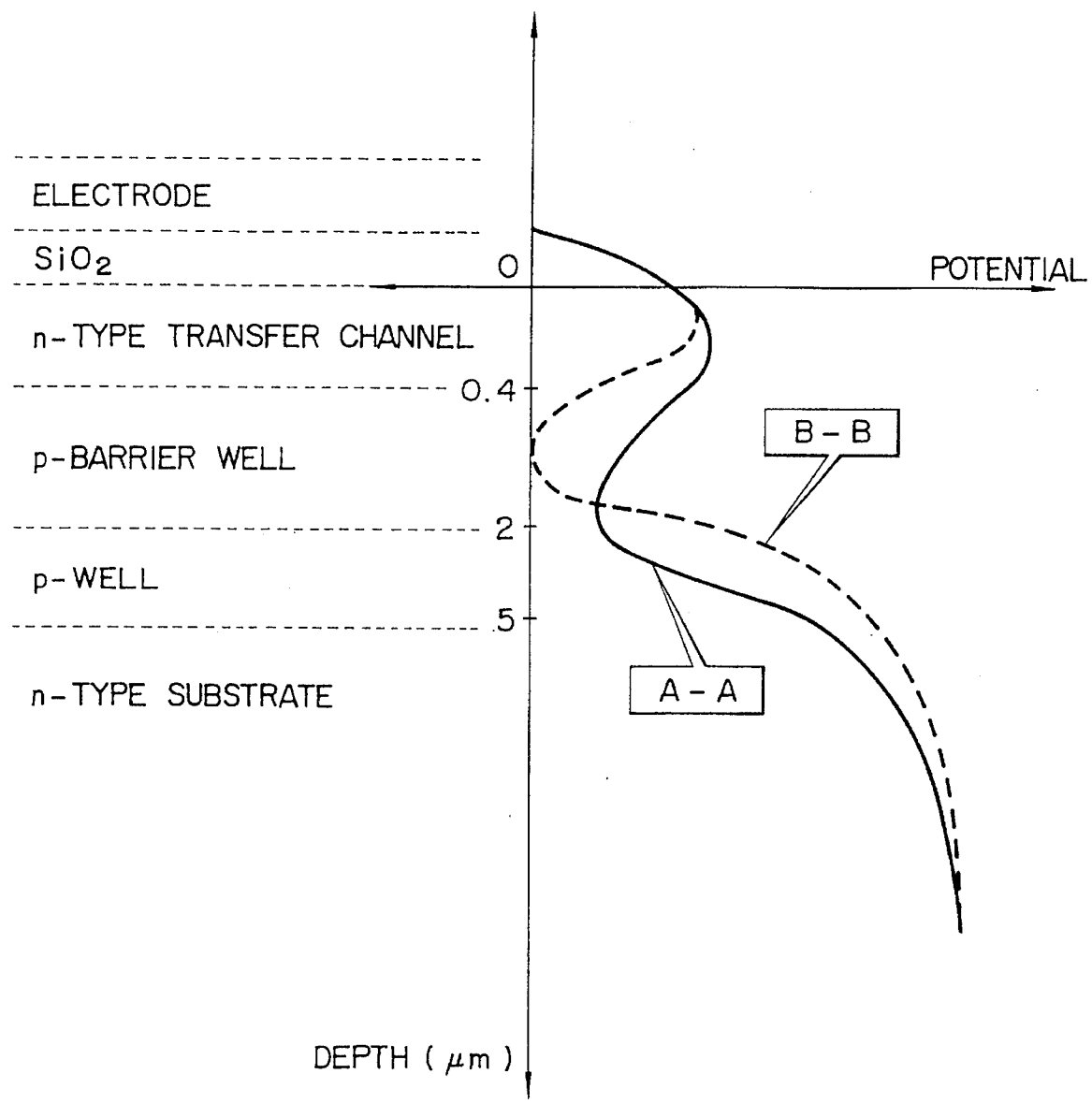
FIG. 3 is a graph showing an example of a potential distribution in the depth direction of the transfer channel of the solid-state imaging device according to the first embodiment shown in FIG. 2.

When such the construction is provided, a potential distribution from the semiconductor substrate surface toward inside is shown in FIG. 3. This figure is shown such that an under side of the paper is deeper from the surface into the inside, and a right side of the paper has a higher potential. In this figure, a solid line shows the potential distribution in the A—A direction which does not include the barrier well 51 in FIG. 2, and a dotted line shows the potential distribution in the B—B direction including the barrier well 51.

Therefore, since the depletion position to the well side of the transfer channel reaches to the semiconductor substrate surface at both sides of the transfer channel where the barrier well 51 is formed that is, the density of the barrier well is such that it does not enter a depletion condition, and since the depletion position from the n-type substrate to the well side reaches to the semiconductor substrate, the barrier well 51 functions to prevent the invasion of smear charges into transfer channel 4. In the portion under the transfer channel 4 where the barrier well 51 is not formed, since the barrier position of the lowest well potential resides inside the semiconductor substrate, the fringe electric field is higher, thereby promoting the signal charges to move in the charge transferring direction. In the above embodiment, there is shown an example where a well potential is depleted in the potential distribution of the A—A direction. The present invention is not limited to this example and a depleted position from the transfer channel to the well side may be deeper from a B—B line into the inside of the semiconductor substrate.

In the construction that the barrier well is separately provided at both sides of the transfer channel, it is possible to respectively set the particular impurity density of the respective barrier well by using different masks for forming the barrier well, for example. By using this technology, it is possible to increase the impurity density of the barrier well opposite to the read-out gate and the like. Therefore, it is possible to increasingly reduce the smear because the depleted position from the n-type transfer channel to the well side becomes shallower (nearby the upper surface of the semiconductor substrate).

Figure 4:
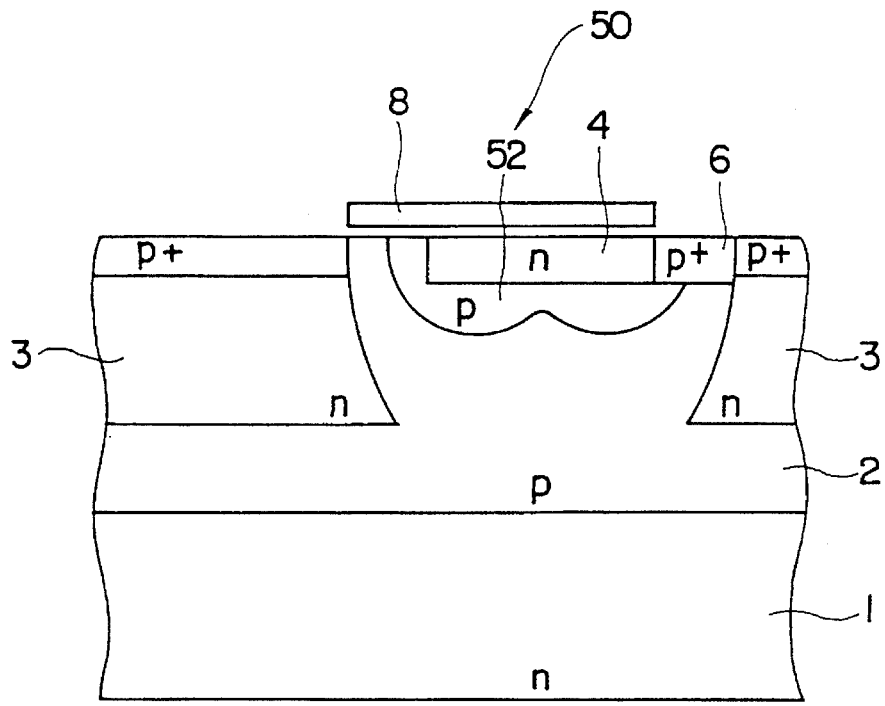
FIG. 4 is a sectional view showing a schematic configuration near a transfer channel of a solid-state imaging device according to a second embodiment of the present invention.

FIG. 4 shows a solid-state imaging device according to a second embodiment. In the figure, a description of duplicated portions corresponding to FIG. 2 will be omitted. In the construction of the second embodiment shown in FIG. 4, a barrier well layer 52 is constituted in a double-well constitution comprising a high density region and a low density region of impurities. A part for contacting to the vertical transfer channel 4 having the double-well constitution, is partially constructed from only the low density region of the impurity. Therefore, since there is a high potential portion of the well barrier potential in the semiconductor substrate which deepens a depleted position of the substrate at the well side of the transfer channel and the fringe electric field activates the signal charges, it is possible to expect the same effect as that by the construction of the first embodiment shown in FIG. 2.

Figure 5:
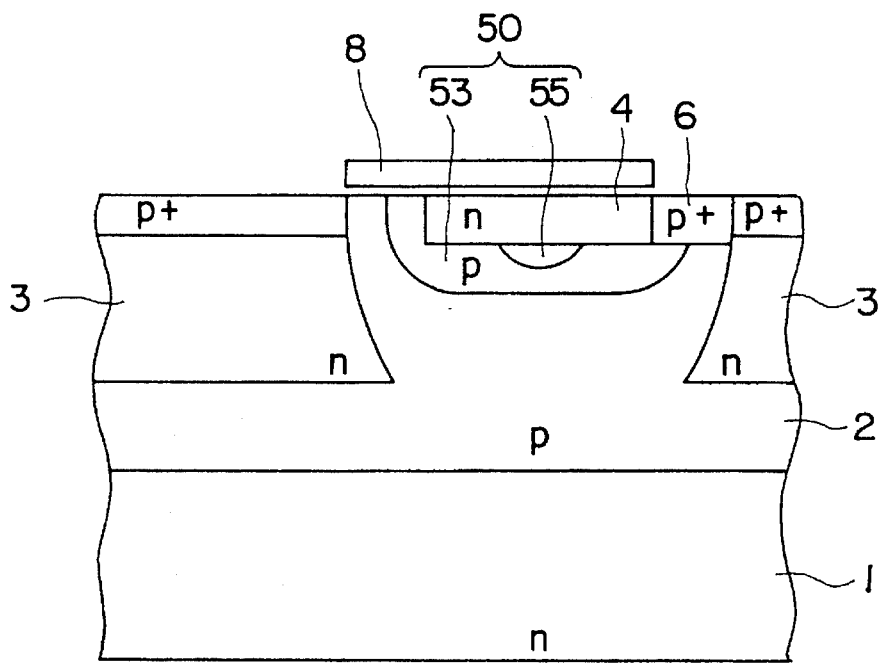
FIG. 5 is a sectional view showing a schematic configuration near a transfer channel of a solid-state imaging device according to a third embodiment of the present invention.

FIG. 5 shows a solid-state imaging device according to a third embodiment of the present invention. In FIG. 5, a description of duplicated portions corresponding to FIG. 2 is omitted. In a construction shown in FIG. 5, there is shown an example in which an n-type impurity region 55 is partially formed in a uniform p-type barrier well layer 53 to provide a barrier well 50 having an impurity density partially reduced in the p-type barrier well layer 53. In this case, since the depleted position of the transfer channel at the well side is deepened by an occurrence of the high well barrier potential in the low impurity density portion, the fringe electric field also has an effect on the signal charges.

In such a manner, since the several embodiments of present invention have the construction in that the gap or the low-impurity density region is formed in parallel with the transfer channel in the barrier well layer under the vertical transfer channel, it is possible to prevent the invasion of the noise changes from the adjacent region to the transfer channel, and at the same time, to increase the moving efficiency by acting on the fringe electric field to the moving direction of the signal charges.

The present invention can be applied to transfer path of signal charges in various kinds of semiconductor devices, and it is possible to plan a high-speed operation with respect to the operational frequency and prevent smear by applying the present invention not only with the above-mentioned FIT solid-state imaging devices but also with a linear image sensor and the like.

What is claimed:

1. A solid-state imaging device capable of undesired influences caused by false signals added to a charge transfer path, comprising:

a semiconductor substrate formed in a plate shape from an impurity semiconductor material of a first conductivity type;

a well layer formed on at least one surface of said semiconductor substrate by an impurity semiconductor material having a second conductivity type;

a matrix, having two dimensions across the surface of the well layer, of photo-sensitive pixel regions formed of the impurity semiconductor material of the first conductivity type for generating signal charges corresponding to an incident light amount;

a plurality of transfer channels, formed in the well layer of the impurity semiconductor material of the first conductivity type, connecting each of the pixel regions formed along a first direction of the matrix and separated from pixel regions formed in a second direction of the matrix, and for transferring said signal charges generated by the pixel regions;

a plurality of electrodes, each above a respective transfer channel, and adding an electric field to said transfer channels; and a plurality of barrier wells formed of the impurity semiconductor material of the second conductivity type, each of the barrier wells having a first impurity density portion greater than said well layer, such that the well layer may enter a depletion condition while the barrier wells remain in a non-depletion condition, and at least partially surrounding, in the first direction, each of said transfer channels for preventing an invasion of signal charges, occurring in said well layer, into said transfer channels, each of said barrier wells having a second impurity density portion equal to the impurity density of the well layer and arranged beneath respective said transfer channels.

2. The solid-state imaging device according to claim 1, wherein said second impurity density portion of the barrier wells has a thickness less than a thickness of the barrier well near each side of said transfer channels.

3. The solid-state imaging device according to claim 2, wherein said barrier wells have grooves along the first direction beneath the transfer channels such that the second impurity density portions have a thickness less than a thickness of the barrier wells near each side of the transfer channels.

4. The solid-state imaging device according to claim 2, wherein said second impurity density portion of the barrier wells include gap regions between the transfer channels and the barrier wells in the shape of grooves along the first direction of the transfer channels and a boundary surface between said well layer and each of the barrier wells is a flat plane.

5. The solid-state imaging device according to claim 4, wherein said gap regions between the barrier wells and said transfer channels are formed by impurity semiconductor material having the first conductivity type.

* * * * *